US012571846B2

(12) United States Patent
Zhao et al.

(10) Patent No.: US 12,571,846 B2
(45) Date of Patent: Mar. 10, 2026

(54) BATTERY PACK AND STATE OF CHARGE ESTIMATION METHOD THEREOF

(71) Applicant: Nanjing Chervon Industry Co., Ltd., Nanjing (CN)

(72) Inventors: Chenyan Zhao, Nanjing (CN); Ju Li, Nanjing (CN); Hongwei Wang, Nanjing (CN)

(73) Assignee: Nanjing Chervon Industry Co., Ltd., Nanjing (CN)

( * ) Notice: Subject to any disclaimer, the term of this patent is extended or adjusted under 35 U.S.C. 154(b) by 641 days.

(21) Appl. No.: 18/073,687

(22) Filed: Dec. 2, 2022

(65) Prior Publication Data

US 2023/0204670 A1 Jun. 29, 2023

(30) Foreign Application Priority Data

Dec. 28, 2021 (CN) .......................... 202111632544.6

(51) Int. Cl.
*G01R 31/382* (2019.01)
*G01R 31/36* (2020.01)
(Continued)

(52) U.S. Cl.
CPC ....... *G01R 31/382* (2019.01); *G01R 31/3648* (2013.01); *G01R 31/396* (2019.01); *H01M 10/425* (2013.01); *H01M 10/486* (2013.01); *H02J 7/0044* (2013.01); *H01M 2010/4271* (2013.01)

(58) Field of Classification Search
CPC .............. G01R 31/382; G01R 31/3648; G01R 31/396; H01M 10/425; H01M 10/486; H01M 2010/4271; H01M 2220/30; H02J 7/0044

See application file for complete search history.

(56) References Cited

U.S. PATENT DOCUMENTS

2005/0269991 A1 12/2005 Mitsui
2018/0348307 A1* 12/2018 Chow ................... G06F 30/367
(Continued)

FOREIGN PATENT DOCUMENTS

CN 203894390 U 10/2014
CN 109752660 A 5/2019
(Continued)

OTHER PUBLICATIONS

Office Action from Canadian application No. 3,185,300, dated Jun. 19, 2024, 4 pp.

*Primary Examiner* — Ricky Go
(74) *Attorney, Agent, or Firm* — Greenberg Traurig, LLP

(57) ABSTRACT

A battery pack and a state of charge (SOC) estimation method of the battery pack are provided. The method includes estimating an SOC of the battery pack based on a real-time current flowing through the battery pack, where the real-time current is estimated according to real-time parameters of the battery pack, at least part of the real-time parameters of the battery pack are capable of being acquired by querying a battery pack database with at least partially data preset. With the preceding technical solution, a battery pack can be provided which has a low cost and can accurately estimate the SOC of the battery pack without a current detection resistor.

13 Claims, 8 Drawing Sheets

(51) Int. Cl.
    *G01R 31/396*      (2019.01)
    *H01M 10/42*      (2006.01)
    *H01M 10/48*      (2006.01)
    *H02J 7/00*       (2006.01)

(56)              References Cited

U.S. PATENT DOCUMENTS

| | | | |
|---|---|---|---|
| 2019/0036356 A1* | 1/2019 | Subbaraman | H01M 10/488 |
| 2019/0064276 A1 | 2/2019 | Kawai | |
| 2021/0173012 A1* | 6/2021 | Subbotin | G01R 31/3842 |
| 2021/0364574 A1 | 11/2021 | Wei | |
| 2022/0057453 A1* | 2/2022 | Nicklaus | H02J 7/00034 |
| 2022/0187380 A1* | 6/2022 | Bryan | G01R 31/387 |

FOREIGN PATENT DOCUMENTS

| | | |
|---|---|---|
| CN | 109856556 A | 6/2019 |
| CN | 111190109 B | 1/2021 |
| CN | 108931732 B | 6/2022 |
| EP | 4206709 A1 | 7/2023 |
| WO | 2015056964 A1 | 4/2015 |

* cited by examiner

100

10

20

21

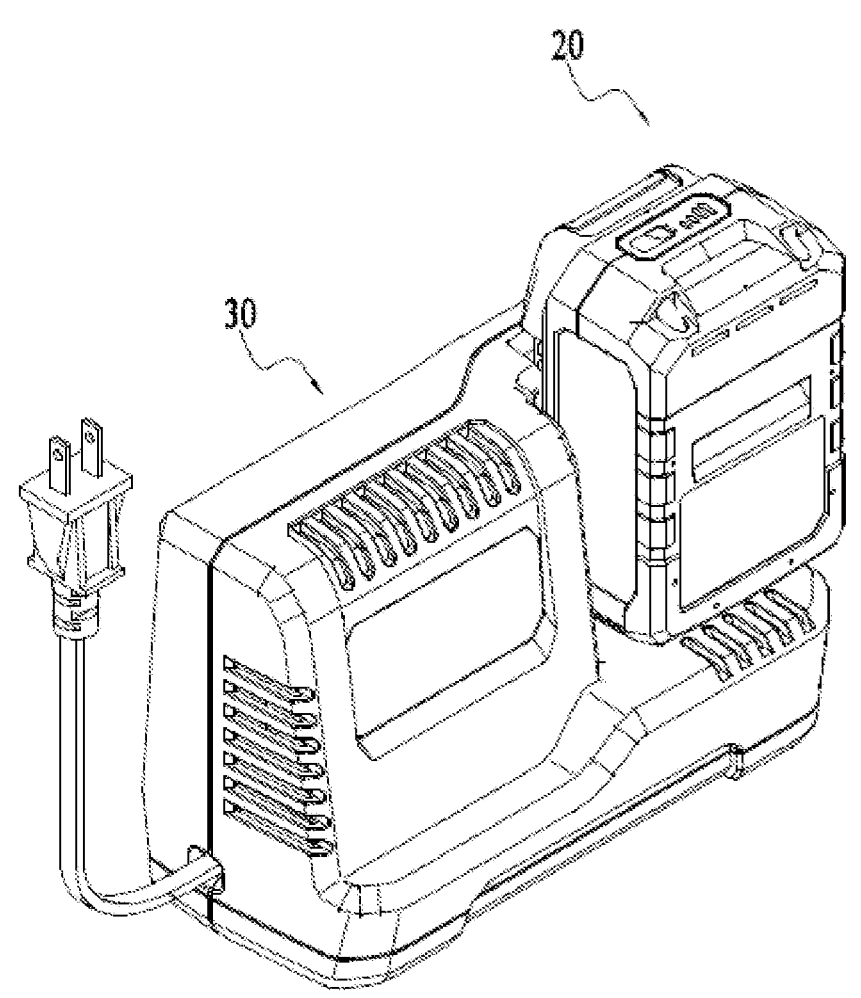
FIG. 2

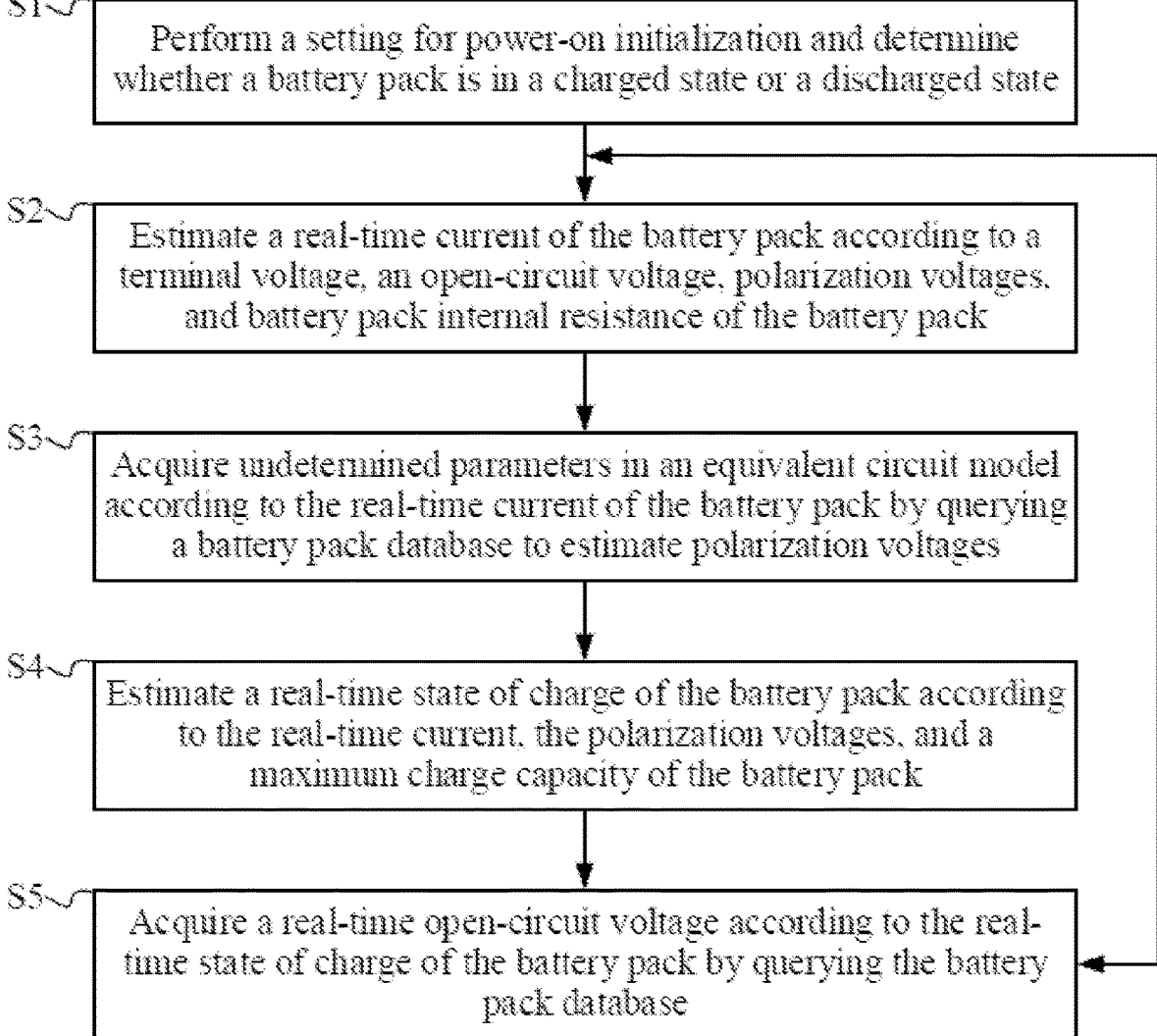

S1   Perform a setting for power-on initialization and determine whether a battery pack is in a charged state or a discharged state S2   Estimate a real-time current of the battery pack according to a terminal voltage, an open-circuit voltage, polarization voltages, and battery pack internal resistance of the battery pack S3   Acquire undetermined parameters in an equivalent circuit model according to the real-time current of the battery pack by querying a battery pack database to estimate polarization voltages S4   Estimate a real-time state of charge of the battery pack according to the real-time current, the polarization voltages, and a maximum charge capacity of the battery pack S5   Acquire a real-time open-circuit voltage according to the real-time state of charge of the battery pack by querying the battery pack database

FIG. 4

BATTERY PACK AND STATE OF CHARGE ESTIMATION METHOD THEREOF

RELATED APPLICATION INFORMATION

This application claims the benefit under 35 U.S.C. § 119(a) of Chinese Patent Application No. CN 202111632544.6, filed on Dec. 28, 2021, which application is incorporated herein by reference in its entirety.

BACKGROUND

A state of charge ("SOC") of a battery pack is an important basis for the charge and discharge control of a battery in a power tool, which directly affects the service life of the battery pack and the performance of the power tool. In addition, the life of the battery pack can be predicted according to the SOC. In the related art, the SOC of the battery pack is estimated mostly by an ampere-hour integration method and a model-based closed-loop estimation method such as a Kalman filter method, a sliding mode observer, and a particle filter method. Such methods require very high accuracy of a current measurement value. A relatively large current measurement error will directly lead to an inaccurate estimation result and then cause serious security problems. To improve the accuracy of SOC estimation of the battery pack, one method is to compensate for a noise effect through the real-time estimation of current and voltage measurement noise statistical characteristics, so as to achieve the relatively accurate SOC estimation of the battery pack. However, this method has a poor suppression effect on a low-frequency drift error during measurement and still requires a current sensor. Thus, the problems of a high cost, a temperature rise, and energy consumption cannot be solved and it is difficult to ensure the stability of results.

SUMMARY

In one example, a state of charge (SOC) estimation method applied to a battery pack of a power tool includes: estimating an SOC of the battery pack based on a real-time current flowing through the battery pack. The real-time current is estimated according to real-time parameters of the battery pack, at least part of the real-time parameters of the battery pack are capable of being acquired by querying a battery pack database with at least partially data preset.

In one example, a method for building the battery pack database includes: establishing an equivalent circuit model of the battery pack; acquiring battery pack internal resistance of the battery pack under different working conditions; acquiring state of charge (SOC)-open-circuit voltage (OCV) curves of the battery pack under the different working conditions; and acquiring undetermined parameters in the equivalent circuit model.

In one example, the equivalent circuit model is set to be a resistor-capacitor (RC) equivalent circuit model or a Warburg equivalent circuit model.

In one example, the undetermined parameters in the equivalent circuit model include direct current (DC) internal resistance, polarization resistance, and polarization capacitance of the battery pack.

In one example, the real-time parameters of the battery pack include an OCV, polarization voltages, a terminal voltage, battery pack internal resistance, and a temperature of the battery pack.

In one example, the polarization voltages are acquired based on the undetermined parameters of the equivalent circuit model and the real-time current.

In one example, the SOC-OCV curves in the battery pack database are queried such that the OCV is capable of being acquired.

In one example, the SOC-OCV curves include charging SOC-OCV curves and discharging SOC-OCV curves.

In one example, the battery pack internal resistance of the battery pack includes at least internal connection resistance of the battery pack and the DC internal resistance.

In one example, the method further includes: acquiring initial parameters of the battery pack when the battery pack is powered on; estimating the real-time current of the battery pack based on the acquired initial parameters and the battery pack database; estimating polarization voltages of the battery pack based on the acquired real-time current; and estimating a present SOC of the battery pack based on the acquired polarization voltages.

In one example, the initial parameters include a total capacity of the battery pack and initial polarization voltages, an initial OCV, and an initial SOC of the battery pack.

In one example, the polarization voltages are estimated based on the real-time current and the battery pack database.

In one example, an OCV of the battery pack is acquired based on the acquired SOC and the battery pack database.

In one example, the different working conditions include at least different temperatures at which the battery pack works, different SOCs in which the battery pack works, or different numbers of cycles under which the battery pack works.

In one example, the estimation method is applicable to at least a battery pack including no current detection device.

In one example, a charging combination includes: a charging device; a battery pack connected to the charging device and including a cell assembly for storing electrical energy; and a battery management system including at least a controller, wherein the controller is configured to estimate a state of charge (SOC) of the battery pack based on a real-time current flowing through the battery pack. The controller is further configured to: acquire the real-time current of the battery pack based on real-time parameters of the battery pack and a preset battery pack database with at least partially data preset.

In one example, the real-time parameters of the battery pack include an open-circuit voltage (OCV), polarization voltages, a terminal voltage, battery pack internal resistance, and a temperature of the battery pack.

In one example, the battery pack is detachably connected to the charging device.

In one example, a power tool system includes: a power tool; a battery pack connected to the power tool and used for powering the power tool; and a battery management system including at least a controller, wherein the controller is configured to estimate a state of charge (SOC) of the battery pack based on a real-time current flowing through the battery pack. The controller is further configured to: acquire the real-time current of the battery pack based on real-time parameters of the battery pack and a battery pack database with at least partially data preset.

In one example, the real-time parameters of the battery pack include an open-circuit voltage (OCV), polarization voltages, a terminal voltage, battery pack internal resistance, and a temperature of the battery pack.

BRIEF DESCRIPTION OF DRAWINGS

FIG. 2 is a perspective view of a charging system as an example in the present application;

FIG. 4 is a flowchart of an SOC estimation method of a battery pack in the present application;

DETAILED DESCRIPTION

The present application is described below in detail in conjunction with drawings and examples.

It is to be understood by those of ordinary skill in the art that a relative term (such as "about", "approximately", and "substantially") used in conjunction with a quantity or a condition includes a stated value and has a meaning indicated in the context (for example, the term includes at least a degree of error associated with the measurement of a particular value, a tolerance (such as manufacturing, assembly, and use) associated with the particular value, and the like). Such term should also be considered as disclosing the range defined by the absolute values of two endpoints. The relative term may refer to an indicated value plus or minus a percentage (such as 1%, 5%, 10%, or more). Of course, a value not modified by the relative term should also be understood as being a particular value with a tolerance.

In the present application, unless otherwise expressly specified and limited, the term "connected to each other", "connected", or "fixed" is to be construed in a broad sense, for example, as "fixedly connected", "detachably connected", or "integrated", as "mechanically connected" or "electrically connected", as "directly connected to each other" or "indirectly connected to each other via an intermediary", or as "connected inside two components" or "an interaction relation between two elements". For those of ordinary skill in the art, specific meanings of the preceding terms in the present application may be construed according to specific situations.

In the present application, unless otherwise expressly specified and limited, when a first feature is described as "above" or "below" a second feature, the first feature and the second feature may be in direct contact or may be in contact via another feature between the two features instead of being in direct contact. Moreover, when the first feature is "on", "above", or "over" the second feature, the first feature is right on, above, or over the second feature, the first feature is obliquely on, above, or over the second feature, or the first feature is simply at a higher level than the second feature. When the first feature is "under", "below", or "underneath" the second feature, the first feature is right under, below, or underneath the second feature, the first feature is obliquely under, below, or underneath the second feature, or the first feature is simply at a lower level than the second feature.

Figure 1:
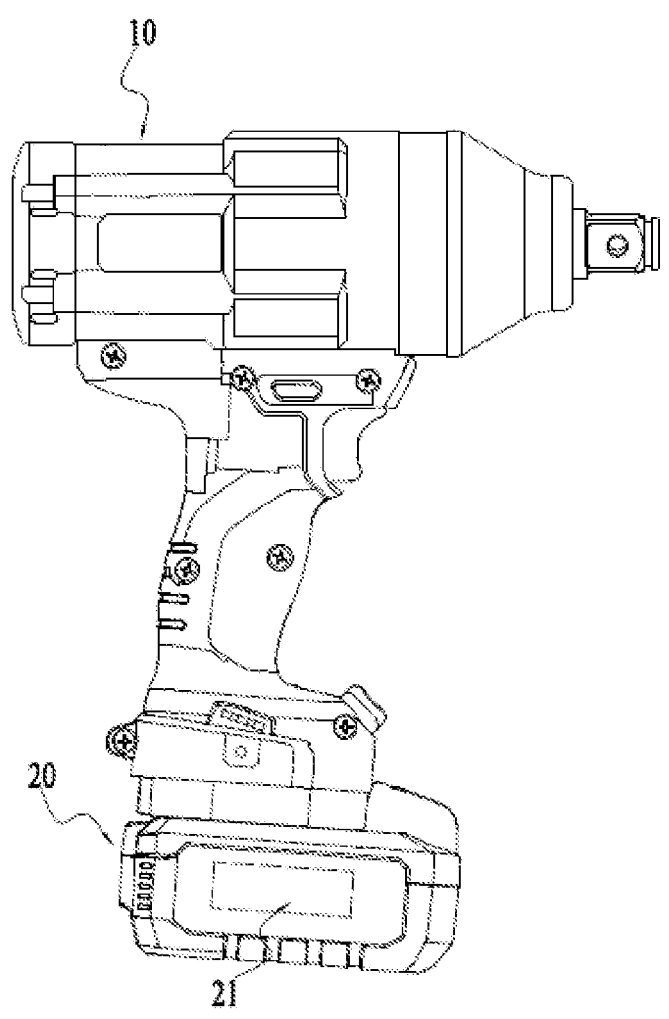
FIG. 1 is a perspective view of a power tool system as an example in the present application.

As shown in FIGS. 1 and 2, a power tool system 100 and a charging combination 200 are provided. The power tool system 100 includes a power tool 10 and a battery pack 20. The battery pack 20 is electrically connected to the power tool 10 to provide electrical energy for the power tool 10.

The charging combination 200 includes the battery pack 20 and a charger for charging the battery pack 20. The battery pack in the present application is applicable to a handheld power tool such as an electric drill, an electric wrench, an electric screwdriver, an electric hammer drill, an electric circular saw, and a sander, an electric table tool such as a table saw, and an outdoor tool such as a lawn mower, a string trimmer, electrical shears, a pruner, and an electric saw. The battery pack is detachably connected to the preceding power tool or fixedly disposed in the preceding power tool. The battery pack in the present application is a rechargeable lithium chemistry battery such as a lithium-ion battery, particularly a cylindrical lithium-ion battery and a pouch battery which are commonly used in power tools. In some examples, the battery pack includes at least one rechargeable cell unit or multiple rechargeable cell units, which depends on different rated nominal values of the battery pack. Multiple rechargeable cell units are connected in series such that these battery packs with different nominal values can be implemented. Of course, the rechargeable cell units may be configured to be other lithium chemistry batteries based on lithium or rechargeable batteries with other chemical bases, for example, nickel-cadmium and nickel-hydrogen rechargeable batteries. Apparently, the battery pack in the present application is limited to neither the preceding power tool nor a designated nominal voltage. In fact, the teachings of the present application are applicable to any type of battery pack.

A shape of the battery pack in the present application may be, but is not limited to, a square, a barrel, a tower, or another shape. Generally, the battery pack includes a housing, at least one cell unit, an electronic device for performing internal and external control and protection measures, battery pack terminals connected to an external charger or the power tool, and a cell unit connection mechanism. Apparently, the preceding internal configurations of the battery pack such as the housing, the at least one cell unit, the electronic device for performing the internal and external control and the protection measures, the battery pack terminals connected to the external charger or the power tool, and the cell unit connection mechanism are universal configurations. Therefore, the details are not repeated in the description and the drawings.

A state of charge estimation method of the battery pack in the present application is described below in detail in conjunction with the drawings. With the state of charge estimation method of the battery pack disclosed in the present application, a state of charge of the preceding battery pack applicable to the power tool or the charger can be efficiently and accurately estimated. For simplicity of description, the state of charge may be abbreviated as "SOC" hereinafter.

In some examples, typically the battery pack also includes a battery management module for storing and acquiring parameters of the battery pack. Specifically, the battery management module includes at least a temperature sensor and a controller. The temperature sensor may be selected from existing temperature detection sensors such as a thermocouple, a thermal resistor, a thermistor, or a fiber Bragg grating sensor.

The SOC estimation method of the battery pack in the present application is implemented based on a battery pack database with at least partially data preset. The battery pack database with at least partially data preset means that a part of data in the battery pack database is preset. In other words, the part of data in the battery pack database in the present application is acquired and stored through multiple tests performed on the battery pack in an offline state. Of course, the battery pack database herein also has the function of receiving data storage in an online state or data reading and storage during after-sale services. A method for building the part of data of the battery pack database is described below.

Figure 3:
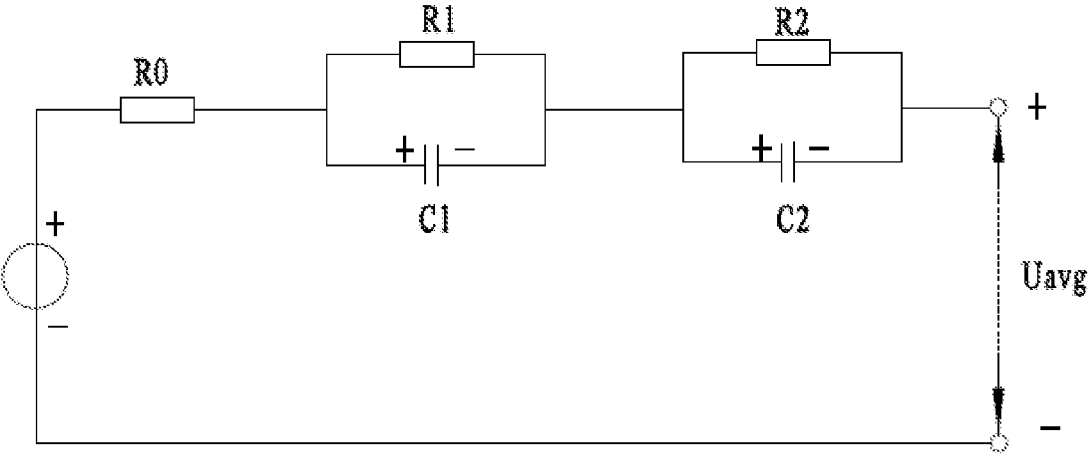
FIG. 3 shows an equivalent circuit model of a battery pack as an example.

Specifically, the battery pack database is built based on an equivalent circuit model of the cell unit of the battery pack. Common equivalent circuit models include first-order, second-order, third-order, and even n-order resistor-capacitor (RC) equivalent circuit models. The first-order RC equivalent circuit model has a relatively large error, and the accuracy of the second-order RC equivalent circuit model and the accuracy of the third-order RC equivalent circuit model are significantly improved. However, a higher order of the RC equivalent circuit model is not as good as expected. When the number of orders is greater than 5, the error of the RC equivalent circuit model increases instead. Considering model accuracy and calculation complexity, the second-order RC equivalent circuit model is selected as the equivalent circuit model of the cell unit in this example. Of course, other forms of equivalent circuit models may be selected such as a Warburg equivalent circuit model. As shown in FIG. 3, the second-order RC equivalent circuit model of the cell unit includes a resistor R0, a resistor R1 and a capacitor C1 which are connected in parallel to each other and then connected in series to the resistor R0, and a resistor R2 and a capacitor C2 which are connected in parallel to each other and then connected in series to the resistor R0.

In some examples, undetermined parameters of the second-order RC equivalent circuit model are acquired through an offline test and stored in the battery pack database for subsequent queries. A method for acquiring the undetermined parameters of the second-order RC equivalent circuit model is described below. Specific steps are described below.

In S11, direct current (DC) internal resistance R0 of the battery pack under different working conditions is acquired.

In the offline test, a voltage U1 of the present battery pack is acquired, then the battery pack is continuously discharged at a current I0, a voltage U2 of the battery pack is acquired after the battery pack is discharged for t seconds, a voltage difference between the voltage U1 and the voltage U2 is calculated, and the voltage difference is divided by the current I0 such that present DC internal resistance R0 is obtained. The preceding process is a method for acquiring the present DC internal resistance R0 of the battery pack. Specifically, in this example, the current I0 is set to 1 C, and the discharge time t is set to 1 second. Of course, those skilled in the art may make a design according to actual test conditions, and the preceding current I0 and discharge time t are not to limit the technical solution.

In some examples, the battery pack database includes the DC internal resistance R0 of the battery pack under multiple working conditions. The preceding multiple working conditions include, but are not limited to, different temperatures, different SOCs, and different numbers of cycles. In some examples, a temperature range in the battery pack database is set to −35° C. to 60° C. In some examples, the temperature range in the battery pack database is set to −25° C. to 50° C. In some examples, the temperature range in the battery pack database is set to −20° C. to 45° C. In some examples, an SOC of the battery pack is set to 5% to 100%. In some examples, the SOC of the battery pack is set to 10% to 100%. For example, a temperature of the battery pack is 10° C. and the SOC of the battery pack is 50% at present. Then, it may be known according to the preceding method for calculating the DC internal resistance R0 that the DC internal resistance R0 of the battery pack in a present state is 22 milliohms. It is to be noted that the DC internal resistance of the battery pack is related to characteristics of the battery pack, and different battery packs may have different DC internal resistance R0 at the same temperature and in the same SOC. As an example, the temperature of the battery pack is adjusted through an ambient temperature, and a present temperature of the battery pack is detected by the temperature sensor so that the battery pack can meet a present temperature requirement. The SOC of the battery pack may be calculated after a voltage of the battery pack is measured by an instrument. Of course, those skilled in the art may acquire the temperature of the battery pack and the SOC of the battery pack in another manner, which is not limited herein.

In summary, those skilled in the art may obtain the DC internal resistance R0 of the battery pack under the multiple working conditions by at least the preceding method. The preceding working conditions include, but are not limited to, different temperatures, different SOCs, and different numbers of cycles. The preceding DC internal resistance R0 under the multiple working conditions is stored in the battery pack database for the subsequent queries.

In S12, a state of charge (SOC)-open-circuit voltage (OCV) curve of the battery pack is acquired.

The preceding SOC-OCV curve includes a charging SOC-OCV curve and a discharging SOC-OCV curve. In some examples, charging SOC-OCV curves and discharging SOC-OCV curves of the battery pack at different temperatures are acquired and stored in the battery pack database. In some examples, charging SOC-OCV curves and discharging SOC-OCV curves of the battery pack under different numbers of cycles are acquired and also stored in the battery pack database for the subsequent queries.

A method for acquiring the charging SOC-OCV curve and the discharging SOC-OCV curve is described below in detail.

As an example, a method for acquiring the discharging SOC-OCV curve is described below.

In S121, the battery pack is charged to 100%.

In S122, the fully charged battery pack is left at rest, and a battery terminal voltage after a rest is measured.

In S123, the battery after the rest is discharged, and in the discharging process, a real-time SOC of the battery pack is obtained by an ampere-hour integration method.

In S124, when the real-time SOC of the battery pack decreases by 1%, the battery pack stops being discharged and is left at rest, and the battery terminal voltage after the rest is measured, which is just an OCV corresponding to a present SOC of 99%.

In S125, steps S123 and S124 are repeated, OCVs corresponding to SOCs with an interval of 1% are recorded until the battery terminal voltage drops to a cut-off voltage, the battery pack stops being discharged and is left at rest, and the battery terminal voltage after the rest is measured, which is just a corresponding OCV when the SOC of the battery pack is 0%.

The discharging SOC-OCV curve of the battery pack can be acquired by the preceding method. In this example, the battery pack is controlled to stop being discharged and be left at rest each time the SOC of the battery pack decreases by 1% in the discharging process such that the corresponding OCVs are acquired. It is to be noted that those skilled in the art may set that the SOC of the battery pack decreases by 2%, 5%, or other specific values each time in the offline test, which is not limited herein.

A method for acquiring charging SOC-OCV curves and discharging SOC-OCV curves of the battery pack under multiple working conditions is described below.

In some examples, the battery pack database includes charging SOC-OCV curves and discharging SOC-OCV curves of the battery packs at different temperatures and under different numbers of cycles. In some examples, the preceding temperature range is set to −35° C. to 60° C. In some examples, the temperature range is set to −10° C. to 55° C. In some examples, a range of the preceding number of cycles is set to 0 to 100. In some examples, the range of the number of cycles is set to 101 to 200. In some examples, the range of the number of cycles is set to 201 to 500. The preceding cycle range should be set according to the characteristics of the present battery pack, which is not limited herein.

A method for acquiring charging SOC-OCV curves and discharging SOC-OCV curves of the battery pack in the offline state at different temperatures and under different numbers of cycles is described below.

In S13, parameters of the cell unit and parameters of the battery pack are acquired.

In addition to the DC internal resistance R0, the cell unit also generates other forms of impedance in a charging or discharging process of the cell unit. Referring to FIG. 3, the second-order RC model of the cell unit also involves polarization resistance R1, polarization resistance R2, polarization capacitance C1, and polarization capacitance C2. Specifically, specific values of the polarization resistance R1, the polarization resistance R2, the polarization capacitance C1, and the polarization capacitance C2 are acquired in the following manner: different excitation signals may be added to the battery pack from the outside such that the polarization resistance R1, the polarization resistance R2, the polarization capacitance C1, and the polarization capacitance C2 of the present cell unit are calculated. It is to be noted that the polarization resistance R1, the polarization resistance R2, the polarization capacitance C1, and the polarization capacitance C2 of the cell unit vary with the attenuation of charging and discharging capabilities of the cell unit, but the variations are negligible in one charging or discharging process. The polarization resistance R1, the polarization resistance R2, the polarization capacitance C1, and the polarization capacitance C2 satisfy the law that they are stable in a short term and vary in a long term. Finally, the parameters of the cell unit including, but not limited to, the polarization resistance R1, the polarization resistance R2, the polarization capacitance C1, and the polarization capacitance C2 are stored in the database for the subsequent queries.

At present, at least two or more cell units are typically disposed in an existing battery pack. In some examples, two cell units connected in series to each other are disposed in the battery pack. In some other examples, four cell units connected in series to each other are disposed in the battery pack. When the multiple cell units in the battery pack are connected in series or in parallel, internal resistance of the battery pack includes not only internal resistance of the cell units but also internal connection resistance between the multiple cell units and other forms of internal resistance, which are collectively referred to as internal connection resistance. To further improve the accuracy of the SOC estimation method of the battery pack, the internal connection resistance of the battery pack is also added to the battery pack database in this example. The internal connection resistance of the battery pack is acquired by a method for identifying the parameters of the battery pack, which is similar to the preceding method for acquiring the parameters of the cell unit.

The method and steps for building the database are described above. It is to be noted that the preceding battery pack database is built in the offline state. That is, relevant parameters of the battery pack are acquired through multiple tests, which are valid and real. Specifically, the relevant parameters in the battery pack database include, but are not limited to, the DC internal resistance R0, the charging SOC-OCV curves, the discharging SOC-OCV curves, the parameters of the equivalent model of the cell unit, and the internal connection resistance of the battery pack. When the temperature of the battery pack varies, the DC internal resistance R0 of the battery pack also varies. When the SOC of the battery pack varies, the DC internal resistance R0 also varies. Therefore, in the preceding battery pack database, the DC internal resistance R0 varies with the temperature of the battery pack, the SOC of the battery pack, or the number of cycles of the battery pack. The charging SOC-OCV curves are obtained under different working conditions of the battery pack. For example, when the temperature of the battery pack varies, the charging SOC-OCV curve of the battery pack and the discharging SOC-OCV curve of the battery pack vary accordingly. When the number of cycles of the battery pack varies, the charging SOC-OCV curve of the battery pack and the discharging SOC-OCV curve of the battery pack also vary accordingly. Therefore, in the database, the charging SOC-OCV curve of the battery pack and the discharging SOC-OCV curve of the battery pack vary with the temperature of the battery pack or the number of cycles of the battery pack. Of course, those skilled in the art may also add other parameters related to the battery pack to the battery pack database.

The method for building the battery pack database is described in detail above. How to estimate the SOC of the battery pack based on the built battery pack database in the present application is described below in detail.

In S1, a setting for power-on initialization of the battery pack is performed.

Initial parameters of the battery pack at a power-on moment are acquired. In this example, the initial parameters include, but are not limited to, the number of cell units connected in series or in parallel, a total capacity of the battery pack, and initial polarization voltages of the battery pack. Of course, the preceding power-on moment includes a power-on moment when the battery pack is charged and a power-on moment when the battery pack is discharged. The number of cell units connected in series or in parallel in the battery pack and the total capacity of the battery pack are the characteristics of the battery pack and may be read directly from the battery pack. The polarization voltages of the battery pack in this step may be queried according to the parameters of the cell unit and the parameters of the battery pack in the battery pack database, and an acquisition method thereof is described in detail below.

Then, an initial OCV of the battery pack and an initial SOC of the battery pack also need to be acquired in the setting for power-on initialization. Specifically, the initial OCV of the battery pack may be directly measured and acquired. The initial SOC of the battery pack may be acquired according to historical data. The preceding historical data refers to that the battery pack has the function of storing a present SOC each time the battery pack is powered off. Of course, if no historical data can be queried, the charging SOC-OCV curve or the discharging SOC-OCV curve in the database may be queried according to the initial OCV acquired currently such that the initial SOC is obtained.

In S2, a current I of the battery pack after being powered on is estimated.

After the setting for power-on initialization of the battery pack is completed, it is determined whether the battery pack is currently in a charged state or a discharged state so as to determine whether the charging SOC-OCV curve or the discharging SOC-OCV curve is queried subsequently. The current I may be calculated through the following formula:

$$I = \frac{Uocv - PV1 - PV2}{R};\qquad(1)$$

where $U_{ocv}$ denotes a present OCV, PV1 and PV2 denote polarization voltages of the battery pack, $U_{avg}$ denotes a terminal voltage of the battery pack, and R denotes the internal resistance of the battery pack including the DC internal resistance R0 of the battery pack and the internal connection resistance of the battery pack. Specifically, the terminal voltage $U_{avg}$ of the battery pack may be detected, and the battery pack database may be queried for R. It is to be noted that when the current is estimated for the first time after the battery pack is powered on, $U_{OCV}$ is the initial OCV acquired in step S1, and PV1 and PV2 are initial polarization voltages.

In S3, the polarization voltages of the battery pack are estimated.

When a current passes through a battery, a potential deviation from equilibrium potential is referred to as electrode polarization. The polarization voltage is an important parameter reflecting the intensity of a chemical reaction inside the battery. When the battery pack is in normal operation, that is, in the charging or discharging process, the polarization voltages of the battery pack also need to be estimated cyclically. In this example, the polarization voltages PV1 and PV2 are estimated according to the following formulas:

$$PV1(k+1) = PV1(k)*e^{\frac{-\Delta t}{R1*C1}} + R1*I\left(1 - e^{\frac{-\Delta t}{R1*C1}}\right) \text{ and};\qquad(2)$$

$$PV2(k+1) = PV2(k)*e^{\frac{-\Delta t}{R2*C2}} + R2*I\left(1 - e^{\frac{-\Delta t}{R2*C2}}\right);\qquad(3)$$

where PV1(k) and PV2(k) denote polarization voltages of the battery pack at a current moment, $\Delta t$ denotes a sampling time, and R1, R2, C1, and C2 denote the parameters of the battery pack.

In S4, the SOC of the battery pack is estimated.

After the current I of the battery pack is known, the SOC of the battery pack may be obtained according to the following formula:

$$SOC(k+1) = SOC(k) - \frac{I(k)*\Delta t}{Qmax};\qquad(4)$$

where Qmax denotes the total capacity of the battery pack obtained in the initialization setting in step S1.

In S5, a real-time OCV $U_{OCV}$ of the battery pack is estimated.

The charging SOC-OCV curve or the discharging SOC-OCV curve in the database is queried according to the SOC of the battery pack estimated in step S4 such that the real-time OCV $U_{OCV}$ of the battery pack is estimated.

In summary, steps S1 to S5 are the method for estimating the SOC of the battery pack in normal operation. As shown in FIG. 4, the power-on initialization is performed on the battery pack, the current I flowing through the battery pack is estimated according to the initial parameters, and the SOC of the battery pack and the polarization voltages of the battery pack are estimated according to the current I of the battery pack. Specifically, the current I flowing through the battery pack is estimated according to the formula (1) and the initialization data of the battery pack. Further, the polarization voltages PV1 and PV2 of the battery pack and the SOC of the battery pack are obtained according to the current I flowing through the battery pack and formula (2), formula (3), and formula (4). In addition, the charging SOC-OCV curve or the discharging SOC-OCV curve is queried according to the SOC of the battery pack such that the OCV $U_{OCV}$ is obtained. Thus, the SOC of the battery pack is estimated for the first time. Then, the preceding steps are repeated. A present current I is obtained according to the present polarization voltages PV1 and PV2 and the present OCV $U_{OCV}$. Further, the present polarization voltages PV1 and PV2 of the battery pack and the present SOC of the battery pack are obtained according to the present current I and formula (2), formula (3), and formula (4). In addition, the charging SOC-OCV curve or the discharging SOC-OCV curve is queried according to the present SOC such that the present OCV $U_{OCV}$ is obtained. Thus, the SOC of the battery pack is estimated for the second time. Then, the present SOC of the battery pack is continuously acquired according to the preceding cyclical steps.

Figure 5:
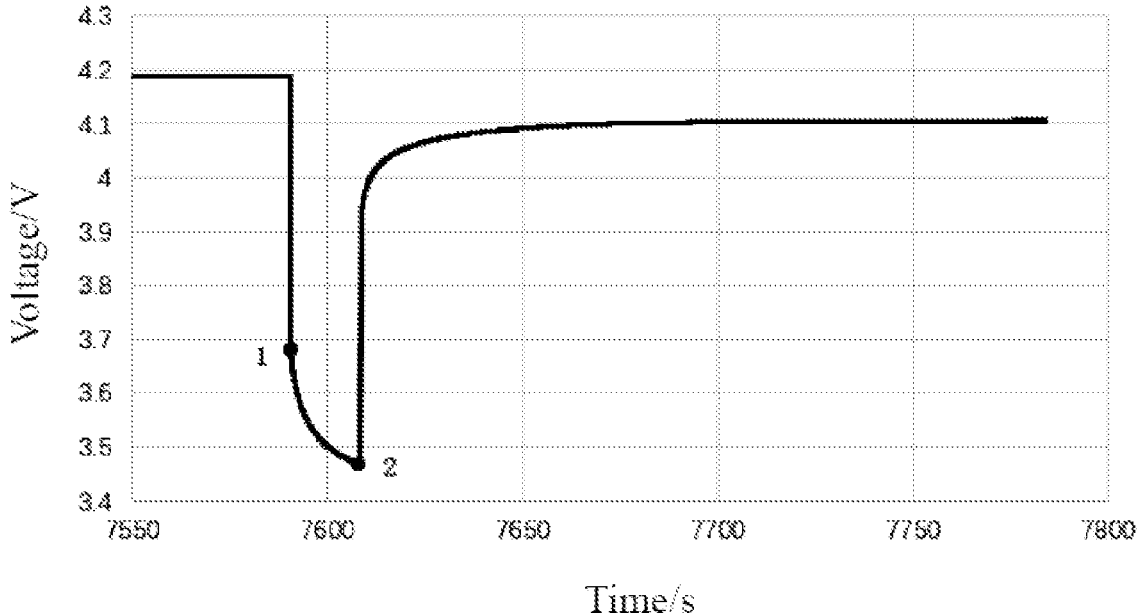
FIG. 5 is a waveform diagram of a polarization voltage of a battery pack acquired by a full rest method.

In the preceding example, the polarization voltages are calculated through data processing on the basis that the accurate battery model is built, which may be understood as the preceding method for acquiring the polarization voltages based on the second-order RC model. In some other examples, the polarization voltage may be detected by a full rest method. A variation of the polarization voltage is detected by the full rest method. Referring to FIG. 5, an ohmic voltage is related to a magnitude of a current. When the charge is stopped instantaneously, the ohmic voltage suddenly disappears, that is, a voltage curve in FIG. 5 is steep at point 1 and point 2. The polarization voltage is a voltage difference between point 1 and point 2.

Figure 6:
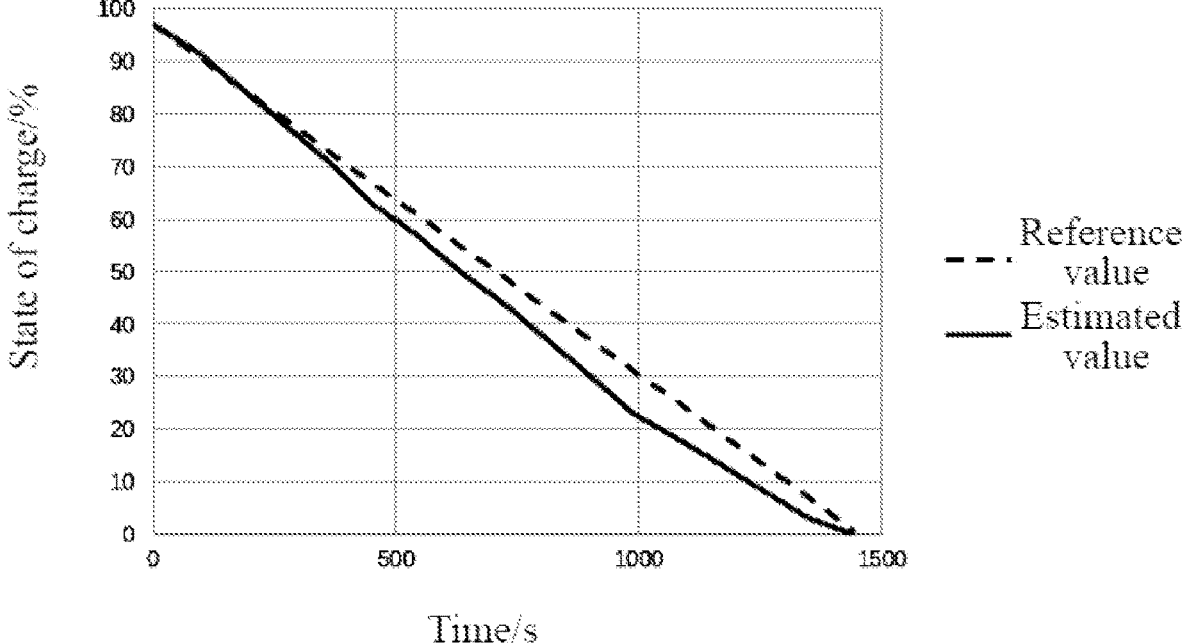
FIG. 6 is a graph showing curves of an estimated value and a reference value of an SOC of a battery pack in a discharging process.
Figure 7:
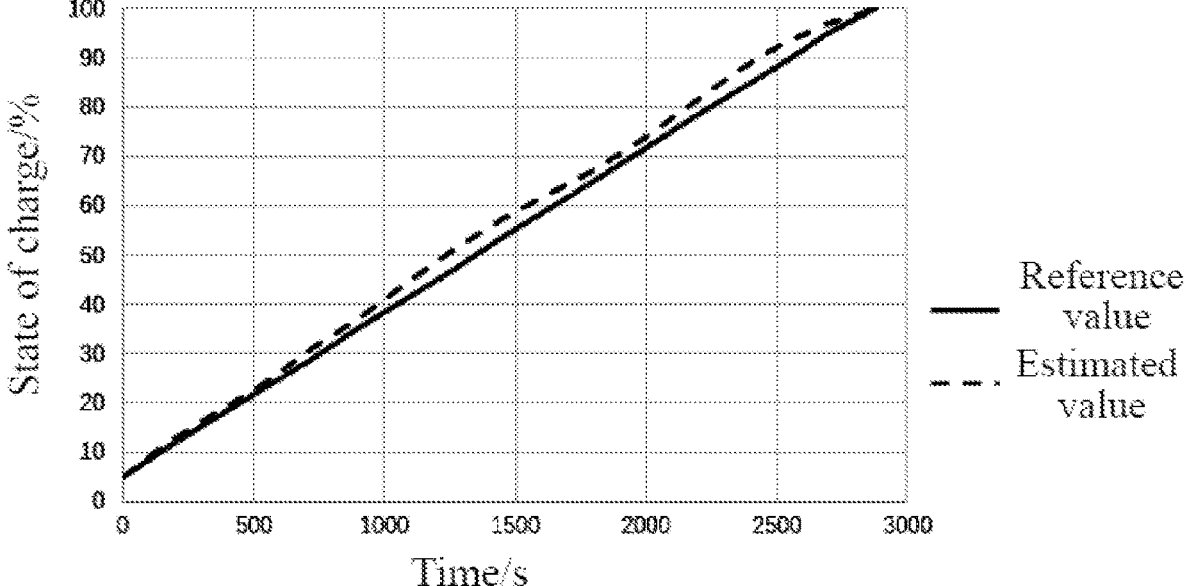
FIG. 7 is a graph showing curves of an estimated value and a reference value of an SOC of a battery pack in a charging process.

FIGS. 6 and 7 are graphs showing the comparison of an SOC of the battery pack obtained by the technical method in the present application with an actual SOC of the battery pack. FIG. 6 shows contrast curves between an estimated value and a reference value of an SOC of a 10 A battery pack in a discharging process. In FIG. 6, a dashed line denotes the theoretical reference value of the SOC of the battery pack, and a solid line denotes the estimated value obtained with the technical solution in the present application. It can be seen from FIG. 6 that a maximum error between the reference value and the estimated value is no greater than 8% with respect to the SOC indicated by an ordinate. FIG. 7 shows contrast curves between an estimated value and a reference value of an SOC of a 5 A battery pack in a charging process. In FIG. 7, a solid line denotes the theoretical reference value of the SOC of the battery pack, and a dashed line denotes the estimated value obtained with the technical solution in the present application. It can be seen from FIG. 7 that a maximum error between the reference value and the estimated value is no greater than 4% with respect to the SOC indicated by an ordinate.

Figure 8:
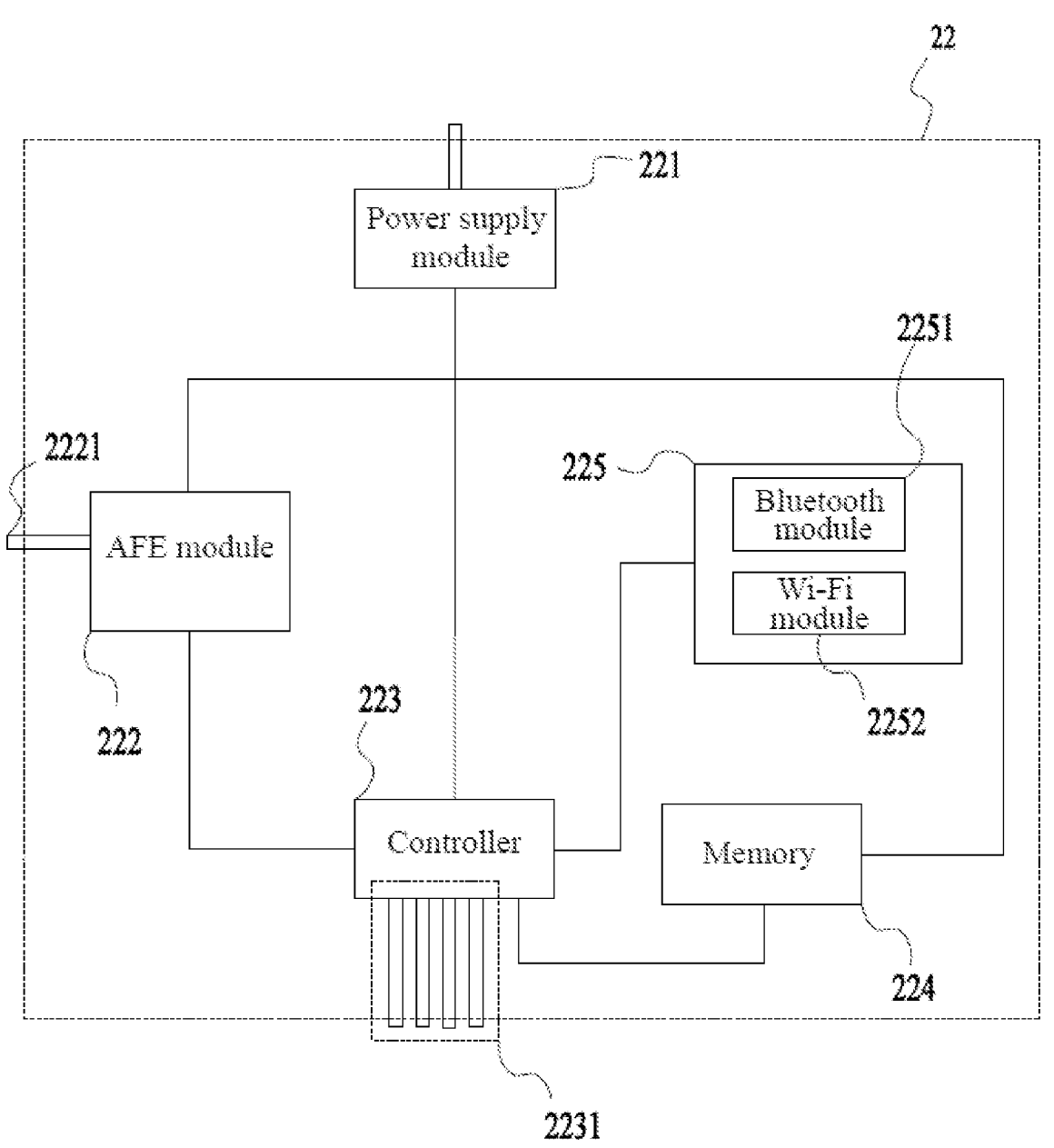
FIG. 8 is a principle diagram of a hardware device of a battery pack as an example.

In some examples, as shown in FIG. 8, the battery pack 20 further includes a battery management system 22 electrically connected to a cell unit 21. Specifically, the battery management system 22 may be disposed in the battery pack 20 or may be disposed in the power tool or the charger electrically connected to the battery pack 20. In some examples, the battery management system 22 includes a power supply module 221, an analog front-end (AFE) module 222, a controller 223, a memory 224, and a wireless communication module 225. The power supply module 221 is configured to power other modules and peripheral circuits in the battery management system 22.

The power supply module 221 is electrically connected to a cell assembly 21 so that the power supply module 221 provides a working voltage for the AFE module 222, the controller 223, the memory 224, and the wireless communication module 225 by using electrical energy in the cell assembly 21.

The AFE module 222 includes multiple interfaces 2221 which are optionally connected to one cell unit 21 or multiple cell units of the battery pack 20 and configured to sample battery pack parameters of the battery pack 20 in operation. Specifically, the battery pack parameters include, but are not limited to, a voltage, a current, a temperature, and the like of the battery pack. The AFE module 222 is electrically connected to the controller 223 and configured to transmit the battery pack parameters of the battery pack 20 sampled by the interfaces 2221 to the controller 223.

The controller 223 is configured to control working states of the other modules in the battery management system 22. The controller 223 is electrically connected to at least the AFE module 222 to acquire the battery pack parameters sampled by the AFE module 222. In some examples, the controller 223 includes multiple input/output (I/O) ports 2231 which are connected to external devices for the input of relevant parameters of the battery pack 20. In some examples, the controller 223 is also electrically connected to the wireless communication module 225 through an internal communication interface to transmit the parameters of the battery pack 20 and control a working state of the wireless communication module 225.

The memory 224 is electrically connected to the controller 223 and configured to store the relevant parameters of the battery pack 20. As an example, the battery pack database involved in the SOC estimation method of the battery pack 20 in the present application is preferably stored in the memory 224.

The wireless communication module 225 is electrically connected to the controller 223. In some examples, the wireless communication module 225 includes a Bluetooth module 2251 and a wireless fidelity (Wi-Fi) module 2252, and the battery management system 22 can implement wireless communication functions through the Bluetooth module 2251 and/or the Wi-Fi module 2252.

It is to be noted that the preceding are only preferred examples of the present application and the technical principles used therein. It is to be understood by those skilled in the art that the present application is not limited to the examples described herein. For those skilled in the art, various apparent modifications, adaptations, and substitutions can be made without departing from the scope of the present application.

What is claimed is:

1. A state of charge (SOC) estimation method applied to a battery pack of a power tool, comprising:

acquiring initial parameters of the battery pack when the battery pack is powered on;

estimating a real-time current of the battery pack based on the acquired initial parameters and data retrieved from a battery pack database;

estimating polarization voltages of the battery pack based on the estimated real-time current;

estimating a present SOC of the battery pack based on the estimated polarization voltages; and using the present SOC of the battery pack in at least one of a charge and discharge operation of the battery pack;

wherein the initial parameters comprise a total capacity of the battery pack and initial polarization voltages, an initial open-circuit voltage (OCV), and an initial SOC of the battery pack.

2. The method according to claim 1, further comprising building the battery pack database by: establishing an equivalent circuit model of the battery pack; acquiring battery pack internal resistance of the battery pack under different working conditions; acquiring state of charge (SOC)-open-circuit voltage (OCV) curves of the battery pack under the different working conditions; and acquiring undetermined parameters in the equivalent circuit model.

3. The method according to claim 2, wherein the equivalent circuit model is set to be a resistor-capacitor (RC) equivalent circuit model or a Warburg equivalent circuit model.

4. The method according to claim 2, wherein the undetermined parameters in the equivalent circuit model comprise direct current (DC) internal resistance, polarization resistance, and polarization capacitance of the battery pack.

5. The method according to claim 2, wherein the different working conditions comprise at least different temperatures at which the battery pack works, different SOCs in which the battery pack works, or different numbers of cycles under which the battery pack works.

6. The method according to claim 1, wherein the polarization voltages are estimated based on the real-time current and further data retrieved from the battery pack database.

7. The method according to claim 1, wherein an OCV of the battery pack is acquired based on the estimated SOC and further data retrieved from the battery pack database.

8. The method according to claim 1, wherein the estimation method is applicable to at least a battery pack comprising no current detection device.

9. A charging combination, comprising:

a charging device;

a battery pack connected to the charging device and comprising a cell assembly for storing electrical energy; and a battery management system comprising at least a controller, wherein the controller:

acquires initial parameters of the battery pack when the battery pack is powered on;

estimates a real-time current of the battery pack based on the acquired initial parameters and data retrieved from a battery pack database;

estimates polarization voltages of the battery pack based on the estimated real-time current and further data retrieved from the battery pack database;

estimates a present SOC of the battery pack based on the estimated polarization voltages; and manages a charging operation between the charging device and the battery pack using the present SOC of the battery pack.

10. The charging combination according to claim 9, wherein the initial parameters of the battery pack comprise an open-circuit voltage (OCV), polarization voltages, a terminal voltage, battery pack internal resistance, and a temperature of the battery pack.

11. The charging combination according to claim 10, wherein the battery pack is detachably connected to the charging device.

12. A power tool system, comprising:

a power tool;

a battery pack connected to the power tool and used for powering the power tool; and a battery management system comprising at least a controller, wherein the controller:

acquires initial parameters of the battery pack when the battery pack is powered on;

estimates a real-time current of the battery pack based on the acquired initial parameters and data retrieved from a battery pack database;

estimates polarization voltages of the battery pack based on the estimated real-time current;

estimates a present SOC of the battery pack based on the estimated polarization voltages;

acquires an open-circuit voltage (OCV) of the battery pack based on the estimated SOC and further data retrieved from the battery pack database; and manages a discharging operation of the battery pack using the present SOC of the battery pack when powering the power tool.

13. The power tool system according to claim 12, wherein the initial parameters of the battery pack comprise an open-circuit voltage (OCV), polarization voltages, a terminal voltage, battery pack internal resistance, and a temperature of the battery pack.

* * * * *